United States Patent
Hu et al.

(10) Patent No.: US 6,573,714 B1
(45) Date of Patent: Jun. 3, 2003

(54) METHOD AND APPARATUS FOR SPATIAL ENCODING USING PSEUDO-FOURIER IMAGING

(75) Inventors: Xiaoping Hu, Minnetonka, MN (US); Yasser M. Kadah, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 893 days.

(21) Appl. No.: 08/842,758

(22) Filed: Apr. 17, 1997

Related U.S. Application Data (60) Provisional application No. 60/015,551, filed on Apr. 17, 1996.

(51) Int. Cl.$^7$ ................................. G01V 3/00
(52) U.S. Cl. ............................ 324/300; 324/309
(58) Field of Search ..................... 324/300, 306, 324/307, 309, 310, 312; 600/410

(56) References Cited

U.S. PATENT DOCUMENTS 4,999,580 A * 3/1991 Meyer et al. ............ 324/309
5,170,121 A * 12/1992 Ogikubo et al. .......... 324/307

OTHER PUBLICATIONS

Healy et al. Two Applications of Wavelet Transfroms in Magnetic Resonance Imaging, IEEE Transactions on Information Theory, vol. 38, No. 2, Mar. 1992.*
Frahm, J., et al., "Rapid Three–Dimensional MR Imaging Using the FLASH Technique", *J. of Computer Assistant Tomography*, 10(2), 363–368, (1986).
Healy, Jr., D.M., et al., "Two Applications of Wavelet Transforms in Magnetic Resonance Imaging", *IEEE Transactions on Information Theory*, 38 , No. 2, 840–860, (1992).
Hu, X., et al., "Reduction of Field of View for Dynamic Imaging", *Magnetic Resonance in Medicine*, 31, No. 6, 691–694, (1994).
Jaynes, E.T., "Matrix Treatment of Nuclear Induction", *Physical Review*, 98, No. 4, 1099–1105, (1955).
Panych, L.P., et al., "Implementation of Wavelet–Encoded MR Imaging", *J. of Magnetic Resonance Imaging*, 3, No. 4, 649–655, (1993).
Parker, D.L., et al., "MR Angiography by Multiple Thin Slab 3D Acquisition", *Magentic Resonance in Medicine*, 17, 434–451, (1991).
Zientara, G.P., et al., "Dynamically Adaptive MRI with Encoding by Singular Value Decomposition", *Magnetic Resonance in Medicine*, 32, No. 2, 268–274, (1994).

* cited by examiner

*Primary Examiner*—Louis Arana
(74) *Attorney, Agent, or Firm*—Schwegman, Lundberg, Woessner & Kluth, P.A.

(57) ABSTRACT

A hybrid imaging technique, applicable to at least magnetic resonance imaging with generalized excitation profiles, addresses the problem of visualizing spatial encoding. The invention is an improvement on both the multi-slice and the Fourier encoding techniques, each of which is a special case representing an extreme of the range of allowable values to the number of phase-encoding steps. Therefore, use of values for this parameter in between these two ends achieves a new hybrid technique having varying degrees of similarity to both known techniques. The inventive technique can be close to non-redundant if implemented properly. Comparison to images to those from conventional Fourier encoding is favorable. The invention is also applicable to many other imaging applications such as in magnetic resonance angiography.

11 Claims, 6 Drawing Sheets

METHOD AND APPARATUS FOR SPATIAL ENCODING USING PSEUDO-FOURIER IMAGING

Benefit is claimed under Title 35, United States Code, §119(e) of the U.S. provisional application Serial No. 60/015,551 filed Apr. 17, 1996.

STATEMENT OF GOVERNMENT INTEREST

This invention was made with Government support under grant number RR08079 awarded by the National Institutes of Health. The government has certain rights in the invention.

TECHNICAL FIELD OF THE INVENTION

This invention relates generally to magnetic resonance imaging (MRI), and more particularly to method and apparatus for spatial encoding in MRI applications.

BACKGROUND OF THE INVENTION

In magnetic resonance imaging, spatial localization is achieved using selective excitation or Fourier encoding. These two approaches have rather different, sometimes complementary, characteristics. Selective excitation is realized by applying a band-limited RF pulse in the presence of a slice selection gradient. The spatial resolution attainable with this technique is determined by the slice profile which is a direct function of the slice selection gradient strength and the shape of the RF pulse. In forming an image based on selective excitation (e.g., line scanning), data are acquired using multiple localized excitations each affecting a different region of the imaged field of view. Hence, RF excitations can be interleaved withing the same repetition time, TR, for added efficiency. Moreover, it is possible to update the image locally with few excitations to follow dynamic events occurring in a portion of the field of view. Nevertheless, since each region is excited separately, the signal-to-noise ratio (SNR) can be rather low since no data averaging is implicitly incorporated in this process.

On the other hand, Fourier encoding achieves spatial localization through spatial frequency or phase encoding while the entire volume of interest is excited. By applying varying amounts of Fourier encoding (phase encoding steps) to sufficiently sample the k-space region of interest, the field of view can be reconstructed using a Fourier transform operation. This means that the resolution in this case is in principle unrestricted while keeping an excellent SNR as a direct result of the implicit averaging in the Fourier transform operation. Since the entire field of view is excited each time, the technique is however susceptible to partial saturation as a function of the time interval between excitations. Moreover, the global nature of Fourier encoding lacks the desirable spatial localization property, making it necessary to re-acquire the entire data set to update any portion of the image.

The differences between selective excitation and Fourier encoding are well-recognized and have been carefully taken into consideration in various applications. For example, in volume imaging, multi-slice imaging takes advantage of the interleaving capability of selective excitation to efficiently collect images with high contrast, while 3-D acquisition is routinely used to obtain high resolution, high SNR images. In certain applications, the use of either one of these two techniques may not be optimal and a combination of the two methods may in fact be desired. For example, in time-of-flight magnetic resonance angiography (TOF MRA), the trade-off between SNR, slice thickness, and contrast makes it suboptimal to use either multi-slice or 3-D acquisition. This motivates the introduction of hybrid techniques to combine features from both techniques. For example, in multiple overlapping thin slab acquisition (MOTSA) (See: D. L. Parker, C. Yuan, and D. D. Blatter, "MR Angiography by Multiple Thin Slab 3d Acquisition," *Magn. Reson. Med.*, Vol. 17, pp. 434–451, 1991), the volume of interest is scanned via the acquisition of a number of slabs, each acquired in a 3-D fashion while the different slabs are covered in a multi-slice fashion. In this case, the thin slabs allowed for good flow contrast while the 3-D encoding within the slabs provided good spatial resolution and an improved SNR. In spite of the success of such hybrid techniques, they are limited by their data inefficiency arising from slab overlapping (as much as 50%). Therefore, a technique that allows smooth and flexible combination of the characteristics of selective excitation and Fourier encoding while acquiring the data efficiently can be advantageous.

More recently, the application of MRI has been extended to interventional and dynamic imaging studies. In most of these applications, only a localized region needs to be updated rapidly. Such applications inspired the development of several novel encoding techniques such as wavelet encoding (See: D. M. Healy, Jr. and J. B. Weaver, "Two Applications of Wavelet Transforms in Magnetic Resonance Imaging," *IEEE Trans. Info. Theory*, Vol. 38, No. 2, pp. 840–860, 1992; and G. P. Zientara, L. P. Panych, and F. A. Jolesz, "Dynamically Adaptive MRI with Encoding by Singular Value Decomposition," *Magn. Reson. Med.*, Vol. 32, pp. 268–274), and Singular Value Decomposition (SVD)-based encoding. Nevertheless, problems in the practical implementation and use of these techniques for actual clinical applications hindered such techniques from becoming realistic alternatives. Therefore, a spatial encoding technique that allows for fast localized image updating while keeping a simple implementation procedure is desirable for such applications.

SUMMARY OF THE INVENTION

The present invention provides a method and apparatus for spatial encoding using pseudo-Fourier imaging (PFI) that addresses the problem of magnetic resonance imaging with flexible excitation profiles acquired at a number of phase encoding steps. In particular, the invention provides an approach for spatial encoding based on acquiring a set of windowed Fourier transform coefficients. This new procedure embodying the invention is shown to be a general technique representing a flexible hybrid of selective excitation and Fourier encoding. In particular, the imaging technique of the invention corresponds to the multi-slice technique at one extreme and the Fourier encoding technique at the other. The condition under which the reconstruction process is stable are described demonstrating that its implementation can be readily achieved on the current MRI systems.

DETAILED DESCRIPTION OF THE INVENTION

In the following detailed description of the preferred embodiments, references made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that structural, logical, physical, architectural, and electrical changes may be made without departing from the spirit and scope of the present invention. The following detailed description is, therefore, not to be taken in a limiting sense, and the scope of the present invention is defined only by the appended claims and their equivalents.

Figure 1:
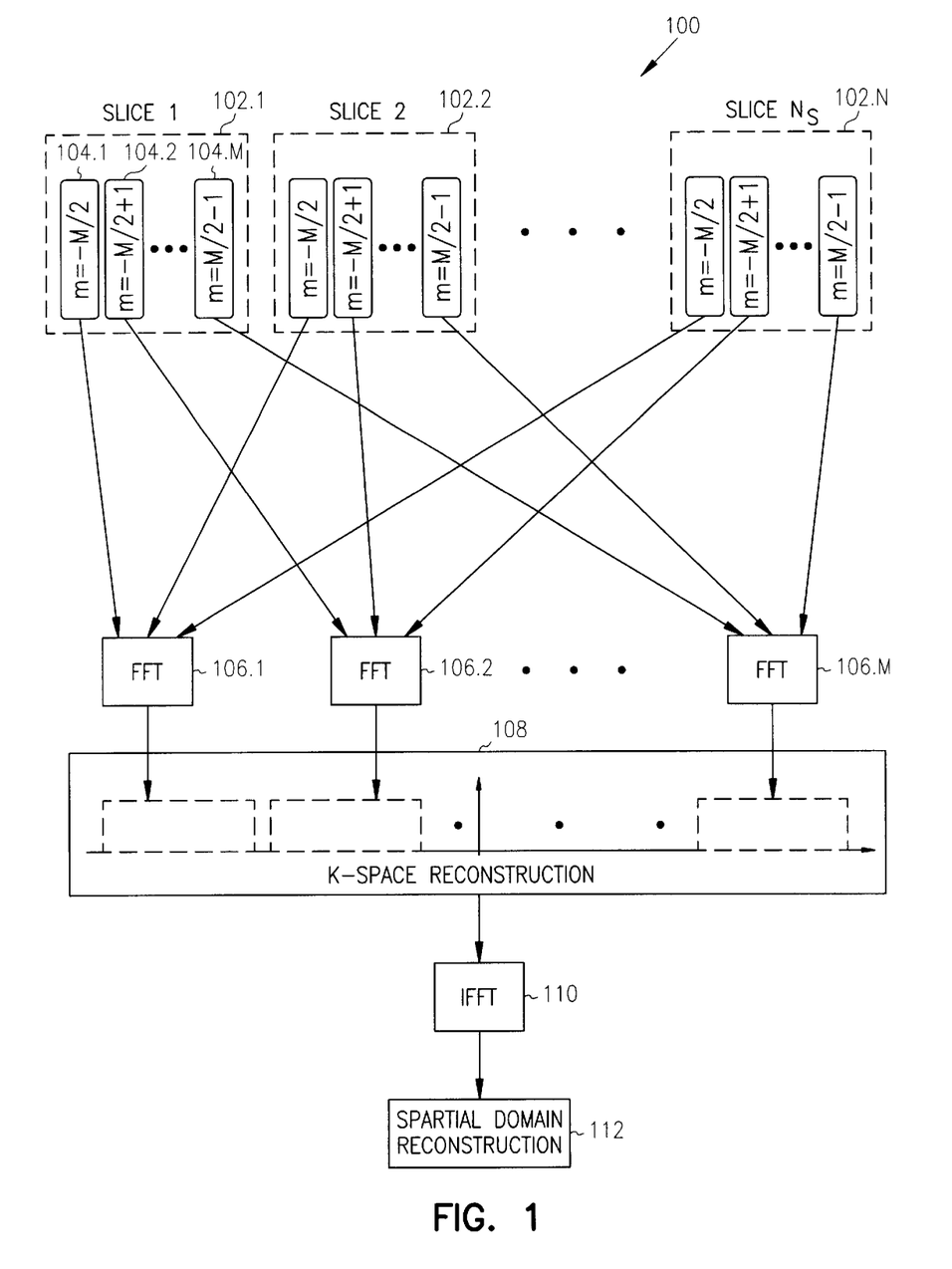
FIG. 1 is a schematic conceptual block diagram of the imaging process of the invention.
Figure 2:
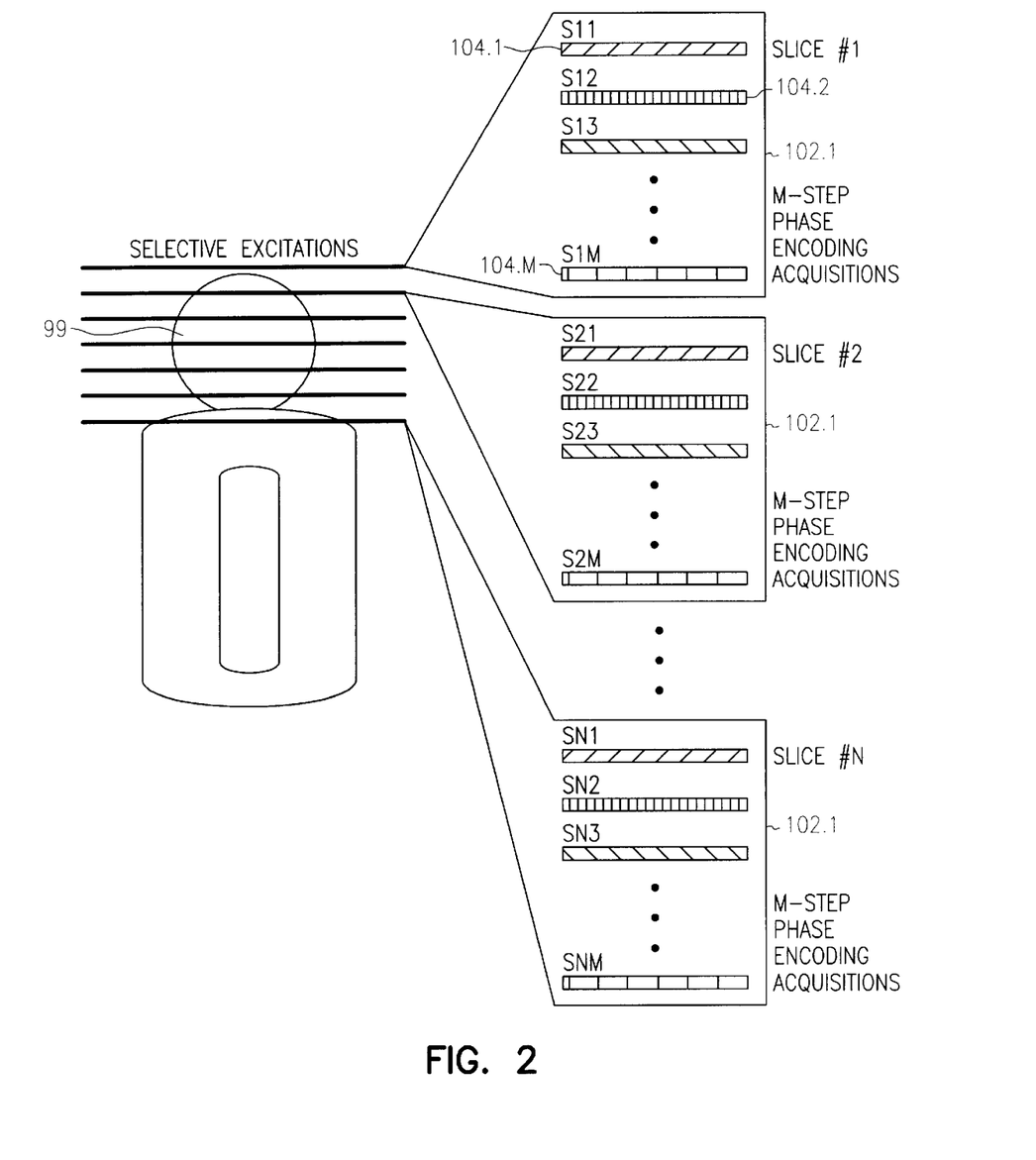
FIG. 2 illustrates a PFI data acquisition according to the present invention.

The invention will be illustrated with respect to the example of imaging a one-dimensional object of signal intensity f(x), as shown schematically in FIG. 1 and FIG. 2. This is only an illustration to explain the invention and is not to be construed as a limitation on the applicability of the invention. An object is excited with RF excitation whose profile is s(x), which can represent one slice of object 99 (see FIG. 2); this excitation is repeated N times with frequency shifts such that the set of excited profiles 102.1, 102.2, . . . 102.N corresponds to $s(x-x_n)$, n=1, 2, . . . , N. At each location $x_n$, the excitation is repeated with a different amount of phase-encoding to generate M phase-encoded signals 104.1–104.M. The object can be considered to have a band-limited k-space 108 that vanishes everywhere except within the interval $[-BW_{max}/2, +BW_{max}/2]$. K-space reconstruction 108 is processed by inverse FFT processor 110 to reconstruct spacial domain reconstruction 112. The invention permits the reconstruction of the k-space of this object by acquiring a set of generalized slices with several phase encoding steps. The difference between conventional slices and generalized slices is in the support of the slice profiles. Generalized slice profiles have supports that are more flexible and can be theoretically infinite, unlike conventional slice profiles which have to be compact. Hence, these excitation profiles are members of the class of functions with frequency spectra $S(\omega-\omega_i)$, where $S(\cdot)$ is a basic window that has infinite support in general and i takes the values 1,2, . . . ,N. In other words, these excitations have spatial profiles given by $\hat{S}(x-x_i)=S(\gamma \cdot G \cdot (x-x_i))$, which represent repetitions of the same excitation profile with different frequency shifts. Then, the return signal from the n-th slice with the m-th phase encoding step k takes the form:

$$r_m(x_n) = \int_{-\infty}^{\infty} f(x) \cdot \hat{S}(x-x_n) \cdot e^{j2\pi k_m x} dx \quad \text{or,} \quad \text{(Eqn. 1a)}$$

$$r_{mn} = \int_{-\infty}^{\infty} f(x)s(x-x_n)e^{jk_m x} dx. \quad \text{(Eqn. 1b)}$$

where $k_m$ is the phase-encoding vector.

It can be shown that formula 1a can be put in the form of a convolution as:

$$r_m(x_n) = (f(x_n) \cdot e^{j2\pi k_m x_n}) * S(x_i). \quad \text{(Eqn. 2)}$$

Taking the DTFT of this convolution with respect to $x_i$ produces:

$$R_m(\omega) = DTFT\{r_n(x_i)\} = F(\omega+\omega_m) \cdot s^*(\omega). \quad \text{(Eqn. 3)}$$

Here $F(\cdot)$ is the Fourier transform of signal intensity, $s^*(\cdot)$ is the Fourier transform of $S(\cdot)$ with a constant term dropped out, and $\omega_m$ is $2\pi k_m$. By selecting the excitation profiles such that $S(\cdot)$ has a compact support, the obtained k-space is essentially a windowed version of the original. The effect of phase encoding in this formula is to shift the focus of this windowing to scan different parts of the original k-space. By properly selecting the number and step of phase encoding such that the overall span of this windowing forms a complete cover of the k-space interval of interest, an analytical solution to the inverse problem can be found in the form:

$$F(\omega) = \frac{\sum_{m=1}^{M} R_m(\omega+\omega_m)}{\sum_{m=1}^{M} s*(\omega+\omega_m)} \quad \text{(Eqn. 4a)}$$

where M is the number of phase encoding steps. This solution is valid only for $\omega$ values within the support of the denominator. This is equivalent to the condition that the basic window and its translations and modulations form a frame to $L^2(R)$ where $L^2(R)$ is the Hilbert space of all functions {f:R→C }, R is the set of real numbers and C is the set of complex numbers. Moreover, it is possible to reconstruct a limited k-space approximation of the object by acquiring a finite set of the windowed Fourier transform coefficients to uniformly cover the phase-space area of interest. Alternatively, $$F(k) = \frac{\sum_{m=1}^{M} R_m(k-k_m)}{\sum_{m=1}^{M} S(k_m-k)} \quad \text{(Eqn. 4b)}$$

where S(k) is the discretely sampled spectrum of s(x) and F(k) is the continuous Fourier transform of f(x). $R_m(k)$ and S(k) are supported on $[-\Delta k_m/2, \Delta k_m/2]$. Despite the use of the discrete Fourier transform, the spectrum in equation 4b corresponds to a continuous Fourier transform as in the case of conventional imaging methods. Furthermore, although the discretely sampled spectrum of s(x) may be aliased, it does not affect the final result as long as the aliased version, S(k), is known. Subsequently, f(x) is estimated by the inverse Fourier transform of F(k) derived using equation 4b.

It is important here to state and discuss the formal validity conditions under which the above result is valid. First, in Equation (3), to be able to invoke the DTFT without encountering aliasing problems, the sampling along the x dimension should be above the Nyquist frequency. This requirement is quite demanding and could potentially render the inventive technique inefficient if based on the full extension of the k-space of the object. Nevertheless, it can be shown that this is not the case and that this inefficient sampling is redundant. Given that the inventive techniques produce actually a windowed version of the original k-space, the sampling scheme should be based on this much narrower spectrum yielding a far more efficient implementation of the invention.

The second validity condition is that the sum of the frequency spectra of the imaging window shifted by different phase encoding steps forms a cover to the k-space of the object. It can be easily shown that this condition is satisfied when $w_o \cdot x_o \leq 1$ and the combined support of the basic window and its translations in either the time or the frequency domains forms a complete cover to the real line in that domain. This condition can be alternatively visualized from the fact that the reconstruction formula will have poles when the support of the denominator contains some holes. This condition does not however require the different shifts of the imaging window to be non-overlapping, i.e., their sum is a tight cover of the k-space (the real line corresponding to the spatial frequency). Any degree of overlapping is not preferred in the practice of the invention since it requires more phase encoding steps to form the k-space cover, which translates into extra acquisition time. The most preferred implementation is as close as possible to a tight cover.

Two special cases are particularly of interest to show the hybrid nature of the inventive technique. First, in the case when τ tends to be very small, the technique becomes identical to the conventional volume imaging. This would require a very large number of phase encoding steps M to be able to reconstruct the near-continuous k-space as in PFI. For any finite number of phase encoding steps, only obtain a sparse collection of very narrow windows from the k-space of the object can be obtained. This represents the approach in volume imaging where the k-space is sampled by phase encoding.

The other extreme is when τ is very large. In this case, the technique becomes identical to the conventional multi-slice imaging. This represents the case when M=1 in the above equations where only one set of slices is collected. Therefore, by selecting the value of the parameter M in the above equations, the invention can be practiced in a wide variety of applications between the two extreme cases to obtain a trimmed hybrid technique for the specific application at hand.

Potential Applications of PFI

As a general encoding method, PFI can be applied in a number of areas in MRI. In the following, three possible applications are discussed in some detail as examples.

Volume Imaging

Currently, volume imaging is performed through either the acquisition of multiple thin slices of phase encoding in the slice direction. Multiple slice acquisition has the advantage of slice interleaving which allows the use of suitable TR values for proper contrast. On the other hand, multi-slice imaging suffers from slice profile limitations as well as low SNR. With PFI, interleaving can be used to excite the slabs while keeping Fourier encoding which provides better resolution and SNR. Moreover, the trade-off between these characteristics can be controlled flexibly through the selection of the number of slices and phase encoding steps.

Magnetic Resonance Angiography (MRA)

In MRA based on time-of-flight contrast, problems are often encountered in association with both 2-D (multi-slice) and 3-D (thick volume) approaches. The 2-D acquisition provides excellent flow contrast but has a limited slice resolution and SNR. On the other hand, while the SNR and slice thickness are not problematic in 3-D acquisition, saturation of the moving spins in the blood from repeated excitations degrades flow contrast. Hence, a hybrid between the two techniques can be advantageous. PFI provides a natural vehicle for such a hybrid technique. It should be noted here that PFI is different from the MOTSA (multiple overlapped thin-slab acquisition) technique which is based on conventional Fourier imaging (See: D. L. Parker, C. Yuan, and D. D. Blatter, "MR angiography by multiple thin slab 3D acquisition." *Magn. Reson. Med.*, Vol. 17, pp. 434–451, 1991). Moreover, MOTSA suffers from a high degree of redundancy in data acquisition as a result of overlapping between consecutive slabs. In contrast, Pseudo-Fourier imaging can be implemented without any redundancy in data acquisition.

Dynamic Imaging

Another possible application is dynamic imaging. Many authors have suggested different methods of reduced data acquisition, either in the k-space or the spatial domain (See: J. J. van Vaals, M. E. Brummer, W. T. Dixon, H. H. Tuithof, H. Engels, R. C. Nelson, B. M. Gerety, J. L. Chezmar, J. A. den Boer, "Keyhole method for accelerating imaging with contrast agent uptake," *J. Magn. Reson. Imag.*, Vol. 3, pp. 671–675, 1993; and X. Hu and T. Parrish, "Reduction of field of view for dynamic imaging," *Magn. Reson. Med.*, Vol. 31, pp. 691–694, 1994). The objective of these methods is to obtain fast updates of the dynamic information within a given image. Wavelet encoding can be potentially used to limit the dynamic information in both domains (See: D. M. Healy, Jr. and J. B. Weaver, "Two applications of wavelet transforms in magnetic resonance imaging." *IEEE Trans. Info. Theory*, Vol. 38, No. 2, pp. 840–860, 1992). However, its implementation is cumbersome, if not impractical, for many reasons (See: L. P. Panych and F. A. Jolesz, "A dynamically adaptive imaging algorithm for wavelet-encoded MRI," *Magn. Reson. Med.*, Vol. 32, pp. 738–748, 1994; and L. P. Panych, P. D. Jacob, and F. A. Jolesz, "Implementation of wavelet-encoded MR imaging," *J. Magn. Reson. Imag.*, pp. 649–655, 1993). From the above description of the pseudo-Fourier technique, it can be seen that PFI readily permits reduced data acquisition in both domains. For example, to reduce the updated k-space data, one can acquire only the low phase encoding steps. One the other hand, when the dynamic event is know a priori to be localized to within only a small portion of the image, one can limit the number of updates slices. In this case, the pseudo-Fourier technique will only acquire those selective excitations that are localized around the dynamic object, providing a better temporal resolution for the dynamic imaging sequence.

EXAMPLE 1

Figure 3:
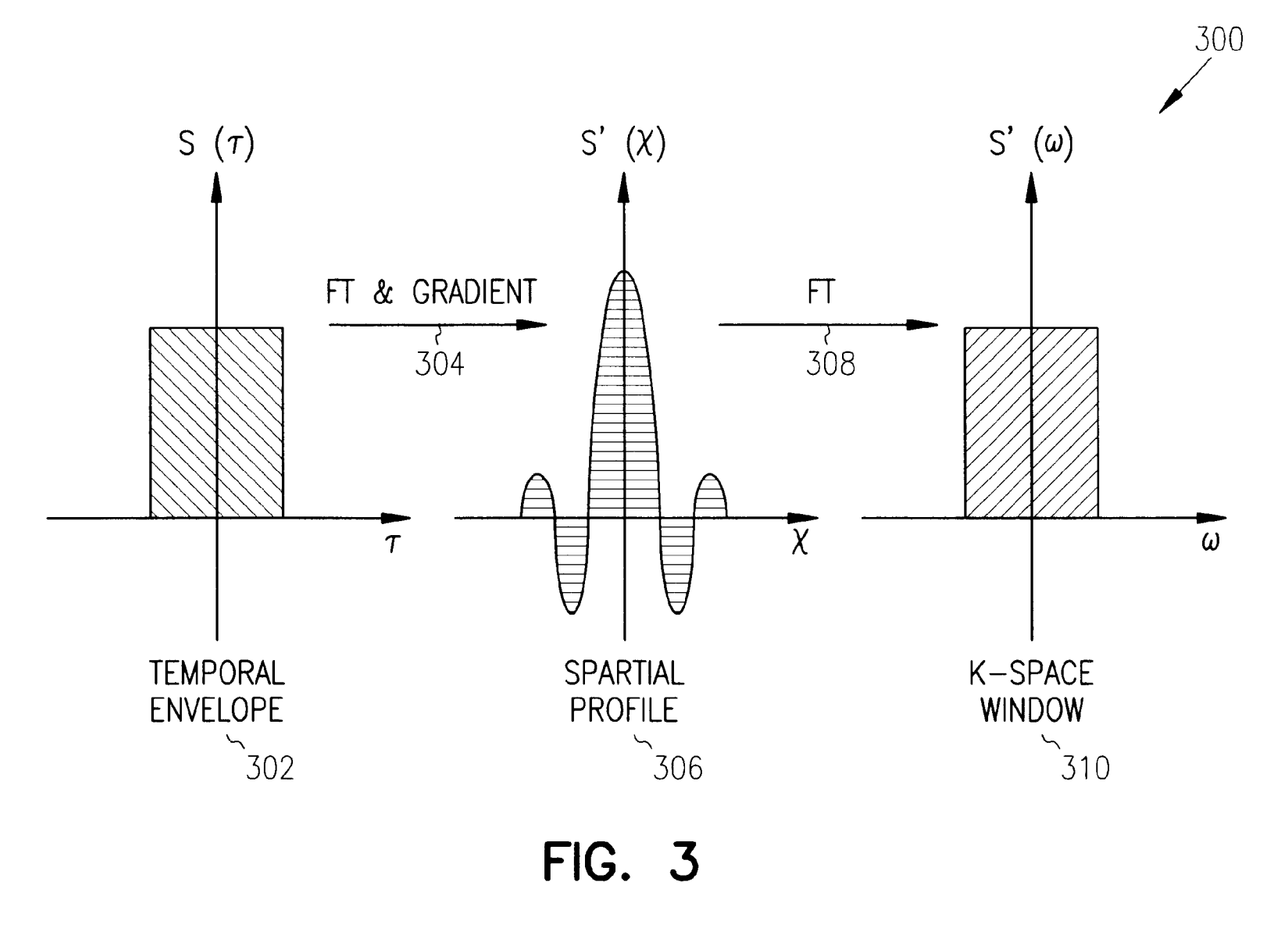
FIG. 3 illustrates RF excitation related to the imaging window of PFI.
Figure 4:
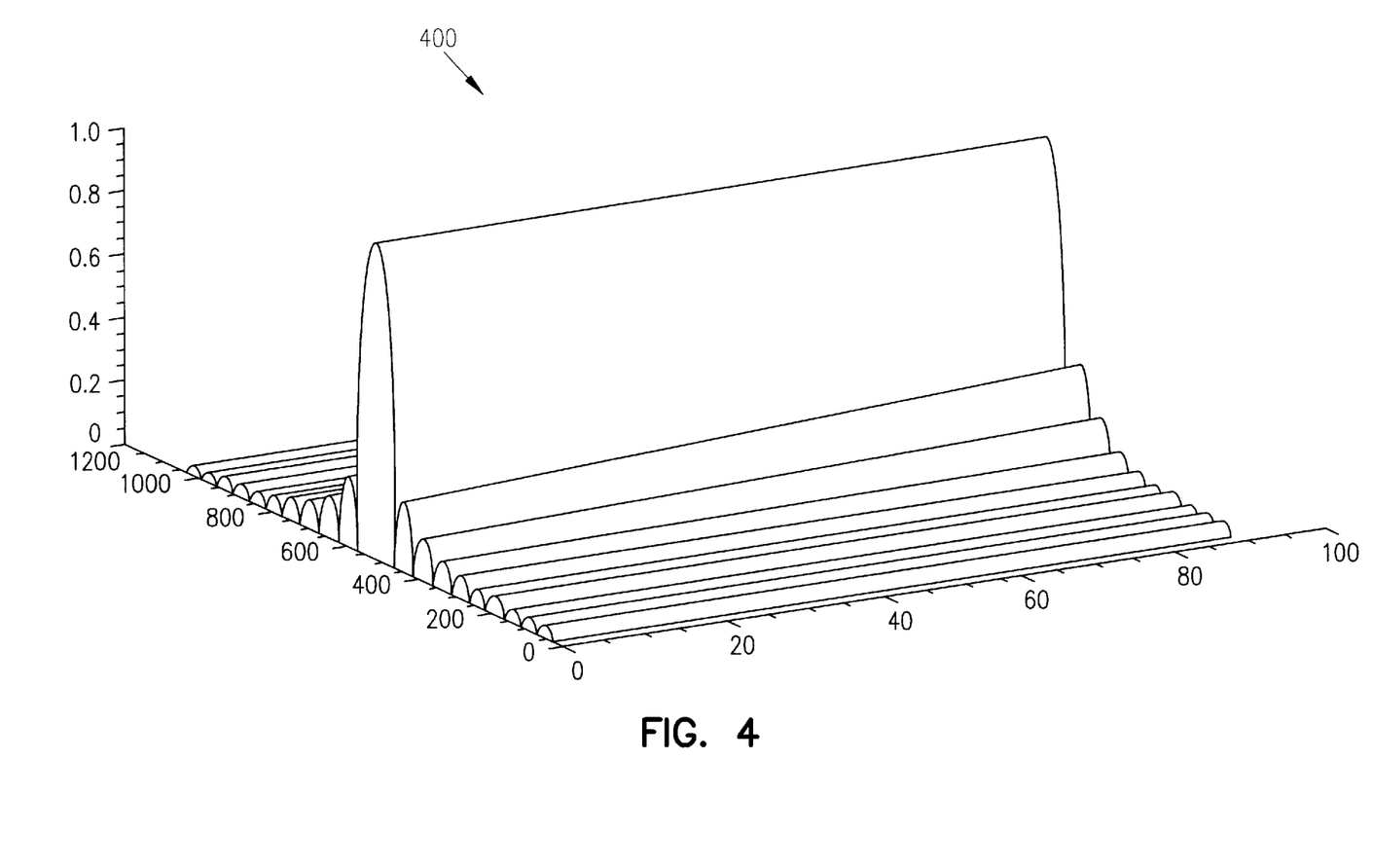
FIG. 4 illustrates a PFI excitation profile variation with flip angle.
Figure 5:
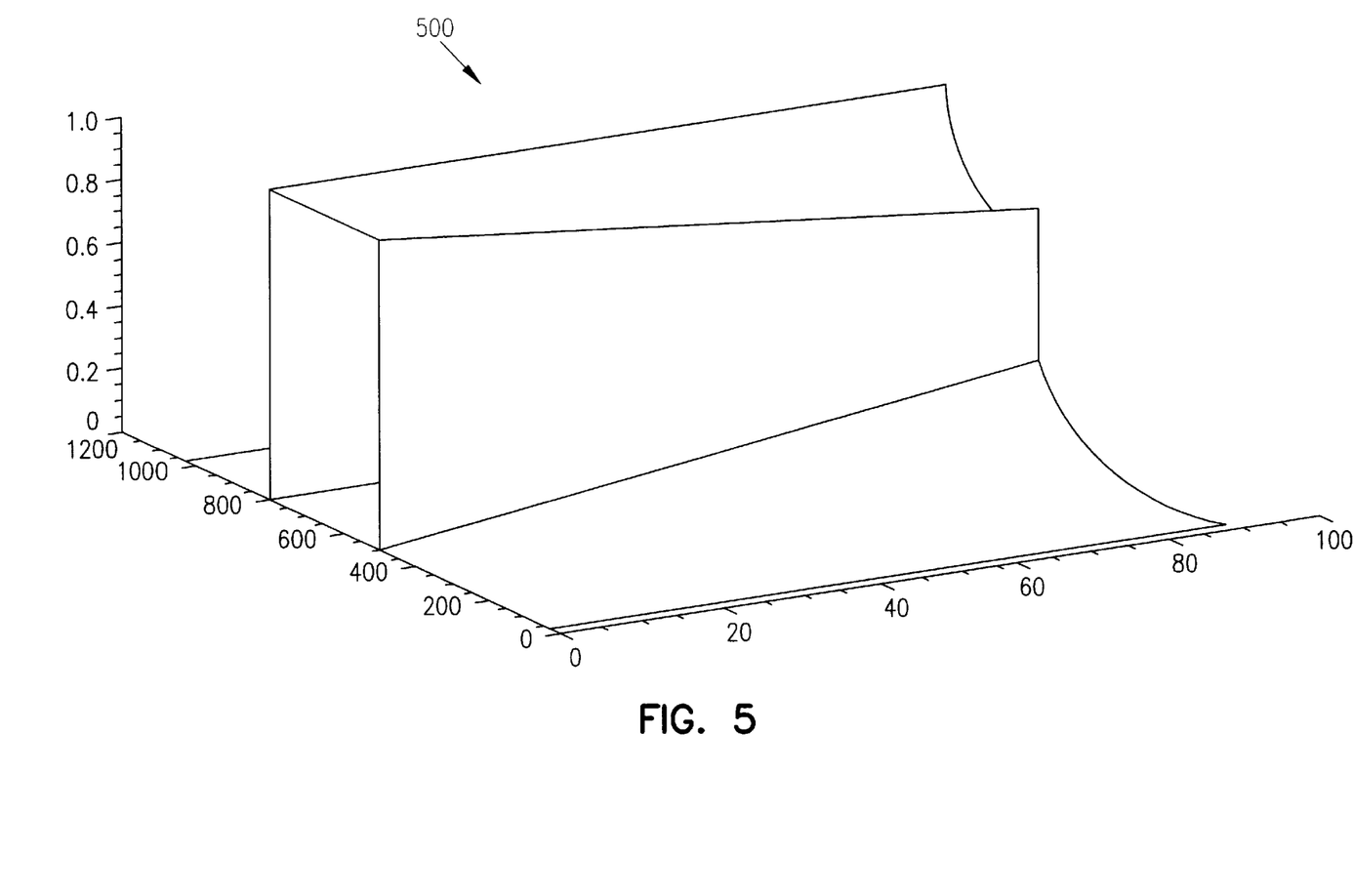
FIG. 5 illustrates an imaging window variation with flip angle.

One example of the use of the invention is the case of the imaging window being a gate function, or pulse. That is, the basic RF excitation function is given by:

$$s(t) = \begin{cases} 1, & |t| < \tau/2 \\ 0, & |t| < \tau/2 \end{cases} \quad \text{(Eqn. 5)}$$

where τ is the temporal support of the imaging window or pulse. Hence, the spatial profile of this excitation will be infinite in extension and in the form of a Sinc function that is peaked at the slice location for flip angles below 30°. In this case, the imaging window of PFI in the k-space approximately takes the form of a rectangular window 310 as shown in FIG. 3. To assess the validity of this approximation, the slice profiles were computed from the exact solution of the block equations (See: E. T. Janyes, "Matrix treatment of nuclear induction," *Physical Review*, Vol. 98, No. 4, pp. 1099–1105, 1955) for the above RF excitation at different flip angles and the results 400 are shown in FIG. 4. The corresponding imaging window shapes of PFI 500 computed by Fourier transforming the excitation profiles are shown in FIG. 5. As can be seen, the approximation of a Sinc excitation profile and a rectangular imaging window asserted above is valid. The spatial frequency span of the excited profile is approximately equal to $\gamma \cdot G \cdot T(m^{-1})$ where $\gamma$ is the gyromagnetic ratio, G is the slice selection gradient in use. Suppose that the imaged object has a band-limited k-space to within $\pm BW_{max}/2$. Then, the support of the excitation $\tau$ is related to the number of required phase encoding steps M according to the following formula:

$$\tau = \frac{BW_{max}}{M \cdot \gamma \cdot G} \quad \text{(Eqn. 6)}$$

where $\gamma$ is the gyromagnetic ratio, and G is the slice selection gradient in use. The number of required slices should satisfy the Nyquist criterion for spatial frequency bandwidth $BW_{max}/M(m^{-1})$. That is, the required number of slices for an object of length D is given by:

$$N = ceiling\left\{\frac{D \cdot BW_{max}}{M}\right\} \quad \text{(Eqn. 7)}$$

The sampling is more efficient than the usual sampling based on the full bandwidth by a factor of M. The object k-space can be reconstructed by concatenating segments of it from different excitations as can be shown in FIG. 1. This case is the ideal or tight cover case. In this case, all parts of the k-space are acquired only once, making this implementation most efficient.

EXAMPLE 2

To experimentally validate the invention, it was implemented on a SIEMENS vision scanner (SIEMENS Medical Systems, Iselin, N.J.). A set of volume data was acquired for a resolution phantom in which the inventive pseudo-Fourier technique was used to reconstruct the slice direction. The data was obtained using a gradient echo sequence with TR of 40 ms and TE of 6 ms. A 500 $\mu$s square excitation pulse profile was applied in the presence of a 2.9 mT/m gradient for selective excitation. The number of acquired slices (N) was 15 and these slices were a distance of 16 mm apart. In addition to the in-plane encoding (30×30 cm$^2$ FOV and 96×128 matrix), the number of phase encoding steps along the slice direction for the inventive pseudo-Fourier technique (M) was 16. The obtained data was then used to reconstruct a total of 240 slices of 1-mm thickness using Equation (4a) or (4b).

EXAMPLE 3

Data were also obtained using a FLASH sequence (See: J. Frahm, A. Haase, D. Matthaei, "Rapid three-dimensional MR imaging using the FLASH technique," *J. Comput. Assist. Tomogr.*, Vol. 10, No. 2, pp. 363–8, 1986) with a flip angle $\alpha$ of 25°, a TR of 15 ms and a TE of 6 ms. A 512 $\mu$s square excitation pulse profile was used in the presence of a 2.9 mT/m gradient for selective excitation. The number of acquired slices ($N_s$) was 19 and these slices were 16 mm apart. In addition to the in-plane encoding (25.6 cm×25.6 cm FOV and 256×96 matrix), the number of phase encoding steps along the slice direction for the pseudo-Fourier technique (M) was 16. The data were then used to reconstruct a total of 304 slices 1-mm thick using (Eqn. 4b). The pseudo-Fourier technique was used in the horizontal direction. The images produced by the technique exhibited 1-mm resolution in the PFI direction, in agreement with what the pseudo-Fourier theory predicted. The comparison between an image obtained by conventional 2-D Fourier encoding and the corresponding image produced using the PFI technique of the present invention indicates that the new technique provides a similar resolution as the conventional Fourier encoding. Nevertheless, the flexibility of the new technique in combining desirable features of multi-slice and volume imaging will be beneficial for many applications.

For example, in magnetic resonance angiography (MRA), there are problems associated with both multi-slice and thick volume excitations. In multi-slice excitation, the signal-to-noise (SNR) is very low because of the acquired thin slices. On the other hand, while the SNR is high in the thick slab excitation, spin saturation from repeated excitations is a problem. Hence, a hybrid between both techniques would indeed be advantageous to use in this clinical application.

The inventive technique is different from the MOTSA (multiple overlapped thin slices acquisition) technique which is based on conventional Fourier imaging with a high degree of redundancy as a result of the 50% overlapping between consecutive thin slices. Pseudo-Fourier imaging has been shown to be as efficient as the conventional Fourier imaging.

From the Fourier uncertainty principle, any function and its Fourier transform cannot both have compact support. Applying this principle to the compact windowed k-space acquisitions of PFI, it can be shown that the spatial domain representation of each of these windows is infinite in extension in principle. As a result, to perform the discrete-time Fourier transform operation in Equation 3 in the exact sense, an infinite number of samples are required. In practice, a truncated sampling is obtained. In the disclosed implementation of the invention, due to the implicit zero-padding to the truncated sampling in the discrete Fourier transform, the resultant k-space is basically the convolution of the Fourier transform of the sampling window function with the true k-space corresponding to blurring in the computed k-space. This blurring is usually negligible since the k-space is often smooth.

As an unconventional spatial encoding technique, an interesting comparison arises between PFI and other experimental techniques such as SVD or wavelet encoding. The SVD technique is based on the availability of a priori knowledge regarding the object to be imaged (See: G. P. Zientara, L. P. Panych, and F. A. Jolesz, "Dynamically adaptive MRI with encoding by singular value decomposition." *Magn. Reson. Med.*, Vol 32, pp. 268–274). Using this knowledge, it may be possible to determine a reduced set of acquisitions to obtain images that are closest to the original in a least-squares sense. One potential problem of the SVD approach is that in many cases the singular value decomposition of the object yields a set of singular values that are very close, making the reduced representation impossible. The main problem for the SVD technique arises from the availability and applicability of the needed a priori information (See: L. P. Panych, C. Oesterle, G. P. Zientara, and J. Hennig, "Implementation of a fast gradient-echo SVD encoding technique for dynamic imaging," *Magn. Reson. Med.*, Vol. 35, pp. 554–562, 1996). This is especially problematic in application such as dynamic imaging where the image content may undergo drastic changes in a dynamic event. In other words, the singular values of the dynamic information may not be similar to those of the static images known a priori. The pseudo-Fourier technique of the present invention does not assume such a priori description of the imaged object.

PFI should also be compared with the wavelet encoding technique (see D. M. Healy, Jr. and J. B. Weaver, "Two applications of wavelet transforms in magnetic resonance imaging," IEE Trans. Info. Theory, Vol. 38, No. 2, pp. 840–860, 1992). The motivation of implementing wavelet decomposition in most of its original applications is to have basis functions maintaining localization properties in both the spatial and k-space domains. This translates into less ringing artifacts in both domains while retaining the completeness and invertibility of the transform. The main difference between the wavelet encoding and PFI is that the space-frequency plane in the wavelet encoding is sampled non-uniformly, unlike with PFI where it is uniformly sampled on a Gabor grid. Both wavelet encoding and pseudo-Fourier techniques are based on reconstructing the object through obtaining windowed versions of the object spectrum. Nevertheless, the windows used in wavelet encoding are usually overlapping and of different widths, whereas the windows in PFI are identical. This makes the implementation of PFI much easier than wavelet encoding.

The computational complexity of PFI is estimated to be $O(N \log N)$ flops for reconstructing an N-point line. This estimate is independent of the window shape used (or equivalently the basis functions used) with a possible increase of less than 10% in acquisition time in the case of overlapping windows (non-orthogonal basis functions). This presents a significant reduction of the reconstruction complexity over encoding techniques using Hadmard or wavelet basis functions which have reconstruction algorithms with a complexity of $O(N^2)$ flops. This reduction in the computational complexity amounts to several orders of magnitude reduction in the reconstruction time with PFI. The main reasons for this reduction is the spacial structure of the PFI basis functions which allows the use of FFT.

The performance of PFI in the presence of $B_0$ inhomogeneity can also be easily understood. Since the slice profile is the same for all excitations, the associated gradient strength is uniform all along the experiment time. Given that the $B_0$ inhomogeneity effect depends mainly on the gradient strength and that the reconstruction process involves only Fourier transformations, the effect of magnetic field inhomogeneity will be very similar to that encountered with Fourier imaging. The stronger the field gradient, the less the image distortion resulting from the magnetic field inhomogeneity becomes.

Thus, the pseudo-Fourier imaging technique of the present invention, which is based on a uniform sampling of the phase-space plane on a Gabor grid, allows for controlled mixing of selective excitation and Fourier encoding. The technique has potential applications in many areas such as volume imaging, magnetic resonance angiography, and dynamic imaging.

Thus, the present invention provides a hybrid technique that provides the relative advantages of both multi slice selective excitation and Fourier encoding, while keeping their common efficiency. The invention is applicable to the problem of magnetic resonance imaging with generalized excitation profiles. In particular, the invention relies on a novel approach to visualizing the spatial encoding problem. In this approach, the multi-slice and the Fourier encoding techniques are two special cases representing the extremes of the range of allowable values to the number of phase encoding steps. Therefore, the values of this parameter in between these two ends suggest new hybrid techniques that have varying degrees of similarity to both basic techniques. The inventive techniques can be close to non-redundant if implemented properly. The results of implementing the new technique are superior to images obtained from conventional Fourier encoding. The potential of using the new hybrid technique is quite large in many applications such as in magnetic resonance angiography (MRA).

Figure 6:
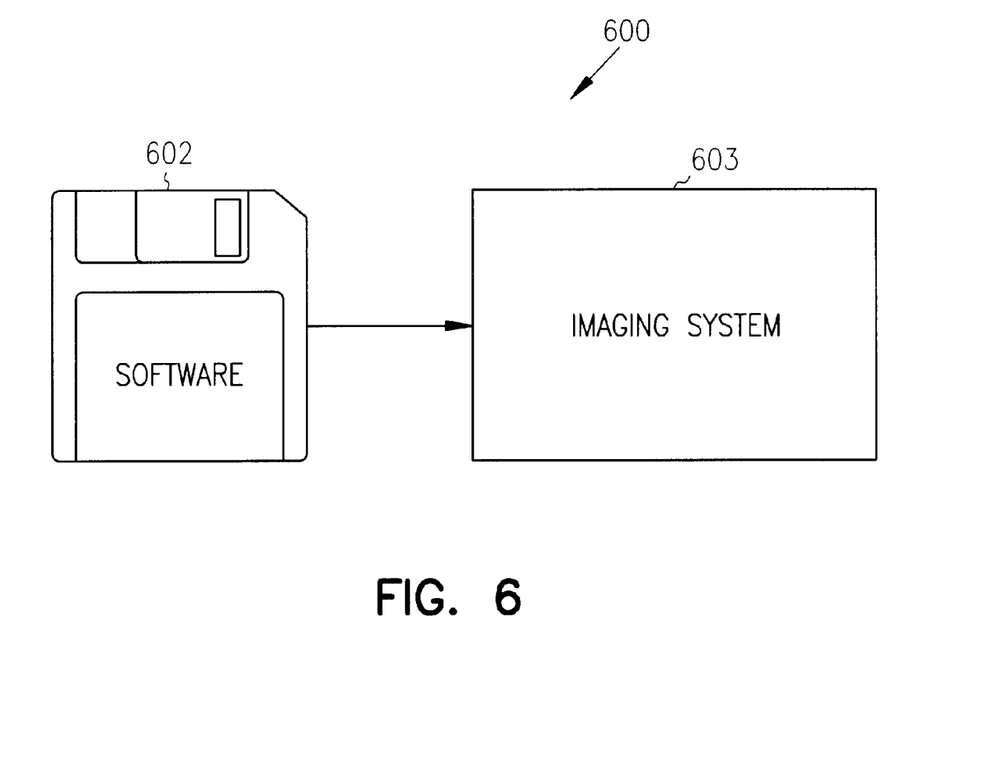
FIG. 6 illustrates a system implementing one embodiment of the present invention.

FIG. 6 illustrates a system 600 implementing one embodiment of the present invention, wherein computer program software 601 is stored on storage medium 602 for transporting and loading into imaging system 603. Storage medium 602 having a computer program 601 stored thereon for causing a suitably programmed system 603 to produce an image of an object by performing the method of the present invention, as described above.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

We claim:

1. A process for imaging an object, comprising the steps of:
   (a) exciting the object at a location with radiation having a plurality of different phase encodings to produce M phase-encoded signals of an excited profile of the object;
   (b) repeating step (a) at each of n locations;
   (c) applying a discrete Fourier transform of n slices to produce a K-space signal of the imaged object which is shifted by the amount of applied phase encoding multiplied by the sampled spectrum of the excitation profile, and
   (d) generating an image from said K-space signal.

2. A system for producing an image of an object, comprising:
   a radiator that excites the object at a location with radiation of a frequency to produce an excited profile of the object;
   a phase encoder coupled to the radiator that changes the amount of phase encoding of the radiation;
   a receiver that receives energy from the excited profile of the object; and
   a discrete Fourier transform processor coupled to the receiver that produces a K-space signal of the imaged object which is shifted by the amount of applied phase encoding multiplied by the sampled spectrum of the excitation profile.

3. The system of claim 2 wherein an imaging device is electrically connected to said system to receive and generate an image from said K-space signal.

4. A storage medium having a computer program stored thereon for causing a suitably programmed system to produce an image of an object by performing the following steps when such program is executed on the system:
   (a) exciting the object at a location with radiation of a frequency to produce an excited profile of the object;
   (b) repeating step (a) N times, shifting the frequency of the radiation to produce subsequent respective excited profiles of the object;
   (c) repeating steps (a) and (b) at each of n locations with different amounts of phase encoding to generate M phase-encoded signals; and
   (d) applying a discrete Fourier transform with respect to n to produce a frequency signal of the imaged object which is shifted by the amount of applied phase encoding multiplied by the sampled spectrum of the excitation profile.

5. A process for imaging an object, comprising the steps of:
   (a) exciting the object at a location with radiation of a frequency to produce an excited profile of the object;
   (b) repeating step (a) n times, shifting the frequency of the radiation to produce subsequent respective excited profiles of the object;
   (c) repeating steps (a) and (b) at each of n locations with different amounts of phase-encoding to generate M phase encoded signals;
   (d) applying a discrete Fourier transform with respect to n to produce a frequency signal of the imaged object which is shifted by the amount of applied phase-encoding multiplied by the sampled spectrum of the excitation profile, and
   (e) receiving said frequency signal of the imaged object and generating an image from said frequency signal.

6. The process of claim 5 wherein an imaging device is electrically connected to said system and said imaging device receives said frequency signal of the imaged object and generates an image from said frequency signal.

7. The process of claim 5 wherein said sampled spectrum is a uniform sampling of a space-phase plane on a Gabor grid.

8. A system for producing an image of an object, comprising:
   (a) a radiator which excites the object at a location with radiation of a frequency to produce an excited profile of the object;
   (b) means for shifting the frequency of the radiation; and
   (c) a processor of a discrete Fourier transform to produce a frequency signal of the imaged object which is shifted by the amount of applied phase-encoding multiplied by the sampled spectrum of the excitation profile.

9. A process for imaging an object, comprising the steps of:
   (a) exciting the object at a location with radiation having a plurality of different phase encodings to produce M phase-encoded signals of an excited profile of the object;
   (b) repeating step (a) at each of n locations to produce a sampled spectrum of the excitation profile;
   (c) applying a discrete Fourier transform of n slices to produce a K-space signal of the imaged object which is shifted by the amount of applied phase encoding multiplied by the sampled spectrum of the excitation profile; and
   (d) generating an image from said K-space signal.

10. The system of claim 9 wherein an imaging device is electrically connected to said system to receive and generate an image from said frequency signal of the imaged object.

11. The process of claim 9 wherein said sampled spectrum is a uniform sampling of a space-phase plane on a Gabor grid.

\* \* \* \* \*